(12) United States Patent
Oster et al.

(10) Patent No.: US 9,658,267 B2
(45) Date of Patent: May 23, 2017

(54) ANALOG SIGNAL INPUT CIRCUIT TO PROCESS ANALOG INPUT SIGNALS FOR THE SAFETY OF A PROCESS

(71) Applicant: Phoenix Contact GmbH & Co. KG, Blomberg (DE)

(72) Inventors: Viktor Oster, Blomberg (DE); Hubertus Lohre, Steinheim (DE)

(73) Assignee: Phoenix Contact GmbH & Co. KG (DE)

( * ) Notice: Subject to any disclaimer, the term of this patent is extended or adjusted under 35 U.S.C. 154(b) by 190 days.

(21) Appl. No.: 14/397,375

(22) PCT Filed: May 16, 2013

(86) PCT No.: PCT/EP2013/001443
§ 371 (c)(1),
(2) Date: Feb. 9, 2015

(87) PCT Pub. No.: WO2013/174490
PCT Pub. Date: Nov. 28, 2013

(65) Prior Publication Data
US 2015/0145522 A1 May 28, 2015

(30) Foreign Application Priority Data
May 24, 2012 (DE) .......................... 10 2012 010 143

(51) Int. Cl.
*G01R 31/02* (2006.01)
*H03M 1/10* (2006.01)
*H03M 1/12* (2006.01)

(52) U.S. Cl.
CPC .......... *G01R 31/02* (2013.01); *H03M 1/1004* (2013.01); *H03M 1/12* (2013.01)

(58) Field of Classification Search
CPC .......... G01R 31/02; H03M 1/004; H03M 1/12
(Continued)

(56) References Cited

U.S. PATENT DOCUMENTS 4,358,823 A 11/1982 McDonald et al.
5,838,899 A 11/1998 Leavitt et al.
(Continued)

FOREIGN PATENT DOCUMENTS

DE 2108496 A1 9/1972
DE 102005011406 A1 9/2006
(Continued)

OTHER PUBLICATIONS

"Related German Patent Application No. 10 2012 010 143.0 Office Action", Nov. 19, 2012, Publisher: DPuM, Published in: DE.
(Continued)

*Primary Examiner* — Billy Lactaoen
(74) *Attorney, Agent, or Firm* — Kaplan Breyer Schwarz & Ottesen, LLP (57) ABSTRACT

An analog signal input circuit with a first number of analog signal detection channels and a diagnostics circuit, with each analog signal detection channel including a third number of analog signal detection circuits and a first connection selection device, and each analog signal detection circuit comprising a first connection device and a second connection device. For each analog signal detection channel, for detecting analog input signals applied at analog signal inputs from a second number of analog signal inputs, and for the respective issuance of output signals for the detected analog input signals, respectively one analog signal detection circuit is alternatingly selected for a certain period of time, not connected to its first connection device comprising an analog signal input for detecting an analog input signal, but used for testing and/or diagnostic purposes.

9 Claims, 4 Drawing Sheets

(58) Field of Classification Search
USPC .......................................................... 324/537
See application file for complete search history.

(56) References Cited

U.S. PATENT DOCUMENTS

| | | | |
|---|---|---|---|
| 6,445,319 | B1 | 9/2002 | Bugeja |
| 6,985,975 | B1 | 1/2006 | Chamdani et al. |
| 7,227,479 | B1 | 6/2007 | Chen et al. |
| 7,949,833 | B1 | 5/2011 | Chen et al. |
| 7,979,746 | B2 | 7/2011 | Cornelius et al. |
| 8,037,364 | B2 | 10/2011 | Kern et al. |
| 2002/0152420 | A1 | 10/2002 | Chaudhry et al. |
| 2005/0240806 | A1 | 10/2005 | Bruckert et al. |
| 2006/0010352 | A1 | 1/2006 | Mukherjee et al. |
| 2008/0176530 | A1* | 7/2008 | Kuhn ................. G01D 5/24461 455/337 |
| 2009/0230255 | A1 | 9/2009 | Lemonovich et al. |

FOREIGN PATENT DOCUMENTS

| | | |
|---|---|---|
| DE | 102007062974 A1 | 6/2009 |
| EP | 1643323 A1 | 4/2006 |
| EP | 2175371 A1 | 4/2010 |
| EP | 2196908 A1 | 6/2010 |
| EP | 2207097 A1 | 7/2010 |
| EP | 2228723 A1 | 9/2010 |
| JP | S57203134 A | 12/1982 |
| JP | 2005525038 A | 8/2005 |
| JP | 2008131298 A | 6/2008 |
| JP | 2008533457 A | 8/2008 |
| JP | 2011049746 A | 3/2011 |
| WO | 2011158120 | 12/2011 |

OTHER PUBLICATIONS

"Related International Patent Application No. PCT/EP2013/001443", "International Search Report and Written Opinion", Oct. 2, 2013, Publisher: PCT/ISA , Published in: EP.

Dyer, et al., "An Analog Background Calibration Technique for Time-Interleaved Analog-to-Digital Converters", "Journal of Solid-State Circuits", Dec. 1988, pp. 1912-1919, vol. 33, No. 12, Publisher: IEEE Service Center; XP011060879; ISSN: 0018-9200, Published in: US.

"Related International Application No. PCT/EP2013/001443", "International Preliminary Report on Patentability", Dec. 4, 2014, Publisher: International Bureau of WIPO, Published in: CH.

"Office Action" issued in Japanese Patent Application No. 2015-513041, dated Jan. 14, 2016.

"Office Action" issued in counterpart Chinese patent application No. 201380027224.5, dated Sep. 26, 2016, Published in: CN.

* cited by examiner

ANALOG SIGNAL INPUT CIRCUIT TO PROCESS ANALOG INPUT SIGNALS FOR THE SAFETY OF A PROCESS

BACKGROUND OF THE INVENTION

The processing of analog input parameters, such as temperature or pressure, is particularly widely common in the processing industry. Many of these signals serve for process monitoring and thus they are frequently of decisive relevance for the safety of the process.

Unlike digital signals, the analog technology is rather expensive, though. The easiest way to check analog circuits for their function is comprised of applying a reference source to the analog circuit, for example, and comparing the value measured with the target value.

However, particularly the requirements of the safety standard DIN EN 91508 for the diagnostics coverage of higher security integrity levels (e.g., SIL2 or SIL3) at the time of the present application are still possible only with an enormously expensive circuitry.

In particular, in order to meet such higher safety integrity standards, other redundantly embodied signal processing structures and respective diagnostics scenarios are known in prior art, to be mentioned here are for example DE 10 2007 062 974 of the same applicant, DE 2 108 496 A, EP 1 643 323 A1, US 2005/240806 A1, U.S. Pat. No. 5,838,899, U.S. Pat. No. 4,358,823, US 2002/0152420 A1, US 2006/0010352 A1, U.S. Pat. No. 6,985,975, EP 2 175 371, EP 2 207 097, EP 2 228 723, EP 2 196 908, U.S. Pat. No. 7,949,833, U.S. Pat. No. 7,979,746, or U.S. Pat. No. 8,037,364.

SUMMARY OF THE INVENTION

In general, such redundantly embodied signal processing structures and corresponding diagnostics scenarios typically show the disadvantage that test units may influence the signal processing structures with safety relevant effects such that a proof of the lack of retroactive effects is connected to very high expenses, with the effect that the diagnostics coverage of the test unit is limited, test pulses of a diagnostics unit are frequently visible to the outside and may disturb the process, and/or that during the testing process the affected signal processing structures are ready for use to a limited extent only and/or the safety function must be disengaged for the test period.

The objective of the invention is to provide a flexible, device-independent, and cost-effective solution for realizing an analog signal input circuit to process analog input signals, particularly for analog input signals relevant for the safety of a process, which meets a safety integrity level even in diagnostics or test scenarios.

Accordingly, one solution of the invention provides an analog signal input circuit with a first number of analog signal detection channels and at least one diagnostics circuit, with each analog signal detection channel being embodied to detect an analog input signal applied at an analog signal input from a second number of analog signal inputs, and accordingly to issue an output signal for a detected analog input signal. Each analog signal detection channel comprises two analog signal detection circuits each and at least one first connection selection device, and each analog signal detection circuit includes a first connection device and a second connection device. Each of the analog signal detection circuits of an analog signal detection channel can be connected at least successively with its first connection device to the same analog signal input from a number of analog signal inputs for detecting an analog input signal, and both analog signal detection circuits of an analog signal detection channel are embodied such that, responding to detected analog input signals matching each other, they issue respective output signals matching each other at the second connection devices. For each analog signal detection channel, for detecting the analog input signal applied at an analog signal input, from the number of analog signal inputs, and for the issuance of the responding output signal matching the detected analog input signal, alternating respectively one of the two included analog signal detection circuits is selected for a certain period of time, not connected to its first connection device with this analog signal input in order to detect this analog input signal but for test and/or diagnostics purposes, and the respectively other one of the two included analog signal detection circuits is selected for a certain period of time to be connected with its first connection device to this analog signal input for detecting this analog input signal, and in response to the detected analog input signal, issuing the output signal of the analog signal detection channel to the second connection device as the output signal. The first connection selection device is embodied to connect the respectively first connection device of the two included analog signal detection circuits responding to the selection at least to either the analog signal input to be connected or to the diagnostics circuit.

An essential advantage is here the fact that the analog signal detection circuits can each be subjected to test and/or diagnostics purposes, as necessary and for a certain period of time via at least the diagnostics circuit, without a first test and/or a diagnostic being provided for subjecting analog signal detection circuits during the diagnosis within the processing chain of the analog signal detection channel to detect analog input signals, to be processed by the analog signal detection channel, and thus not in a safety chain of a process to be controlled with the use of an analog signal detection channel. Thus, control tests can also be performed in which the processing by the analog signal detection channel, and thus also during operation of a safety chain comprising an analog signal detection channel, would otherwise not be permitted. Furthermore, during the diagnostics visible diagnostics signals cannot be applied at the signal inputs, either. Any diagnosis therefore has no compromising influence upon the complete one hundred percent function of the analog signal detection channel. The invention therefore allows high availability, particularly with regards to the specifications in the processing industry.

The first device for selecting connections may here comprise analog switching units, with in each analog signal detection circuit beneficially one analog switching unit being included.

When the analog signal input circuit, due to higher safety integrity levels, shows a number of at least two analog signal detection channels, which for example can also be operated redundantly or can be switched together to form a redundancy block, additionally the advantage results that only the very same analog signal detection circuits are mutually exchanged and thus always one of these two units is integrated in the processing chain of the same analog signal detection channel, while the other one may always be connected to the same diagnostics circuit for diagnostic purposes. Due to the fact that the same environmental conditions can therefore always be ensured for the analog signal detection circuits the analog signal detection channel and the diagnostics circuit with regards to the respectively activated and/or integrated processing components, potential signal deviations between the two analog signal detection circuits, or also errors, can be diagnosed considerably more easily within an analog signal detection circuit.

The invention is therefore based on the acknowledgment that during the processing of analog input parameters, such as temperature or pressure, respective analog input signals, particularly in processing industry and particularly in the case of analog input signals of decisive relevance for the safety of a process, the functionality of an analog signal detection channel of an analog signal input circuit and consequently also the secure operation of a safety chain comprising the analog signal detection channel is not only protected from being compromised but furthermore it can be monitored almost completely for a hundred percent functionality when respectively two analog signal detection circuits are provided in an analog signal detection channel, of which one is surplus for the one hundred percent functionality of the analog signal detection channel and thus respectively one analog signal detection circuit of such an analog signal detection circuit is available for various diagnostics purposes as well as for the exchange for the respectively other analog signal detection circuit, so that it thereafter is available for various diagnostics purposes.

The concept according to the invention is therefore based further on the fact that within every analog signal detection channel at least a dual-redundancy of safety-relevant elements is provided, although the functionality of each individual analog signal detection channel provides no mandatory redundant processing, but perhaps only two or more analog signal detection channels can be operated redundantly or can be switched together to form a redundancy block.

It is pointed out here that a number of one analog signal input or more than two analog signal inputs shall be included in the wording "a number of analog signal inputs" and/or "a second number of analog signal inputs" in the claims as well as the description, so that the number is at least one and otherwise it may be essentially an arbitrary quantity.

For example, another preferred solution of the invention, particularly for detecting faster and/or more time critical analog input signals, provides that every analog signal detection channel is embodied to detect analog input signals applied at a second number of at least two analog signal inputs and accordingly to issue output signals for respectively detected analog input signals, with every analog signal detection channel respectively including a third number of analog signal detection circuits, and with the third number amounting to at least three and being maximally greater by one than the second number. Here too, each of the analog signal detection circuits of an analog signal detection channel shall be connectable to its first connection device with respectively one analog signal input from the second number of analog signal inputs in order to detect an analog input signal, and otherwise it is embodied equivalent to the first solution. In order to detect analog input signals applied at the signal inputs from the second number of analog signal inputs and to issue for the respective outputs of output signals for the detected analog input signals, for each analog signal detection channel respectively one analog signal detection circuit is selected alternating for a certain period of time, not connected to its first connection device with an analog signal input for detecting an analog input signal, but used for testing and/or diagnostics purposes, and all except for this third number of analog signal detection circuits included are respectively selected for this certain period of time, by which the first connection devices are connected to certain analog signal inputs from a second number of analog signal inputs to detect analog input signals and accordingly to issue output signals of the analog signal detection channel for the detected analog input signals at their second connection devices as output signals. The first connection selection device is therefore embodied once more such that it connects the respectively first connection devices of all included analog signal detection circuits in response to the selection at least either to a certain analog signal input to be connected or to the diagnostics circuit.

Particularly beneficial embodiments provide that at least one analog signal detection channel is embodied for also processing digital signals and each analog signal detection circuit for this analog signal detection channel includes an analog/digital converter, with its digital signal connection being switched to the respective second connection device and with its analog signal connection being switched to the first connection selection device.

Particularly beneficial embodiments provide additionally or alternatively that every analog signal detection channel shows a second connection selection device, which is embodied, in coordination with the first connection selection device, to connect the second connection devices, respectively selected, either to a processing device provided for the further processing of the output signal of the analog signal detection channel or to the diagnostics circuit.

Particularly beneficial embodiments additionally or alternatively provide further that the first connection selection device is embodied such that a connection of a respectively first connection device to a certain analog signal input to be connected, to a diagnostics circuit, to at least one reference voltage or to at least one supply voltage of a periphery device can be selected.

Particularly beneficial embodiments further provide additionally or alternatively that the analog signal detection circuit includes an active signal adjustment device and/or a decoupling circuit is allocated to the first connection device and/or that at least one analog signal input is additionally provided with an input protection circuit for an input terminal and/or a passive signal adjustment unit.

BRIEF DESCRIPTION OF THE DRAWINGS

Additional features and advantages of the invention are discernible from the following description of preferred embodiments based on the attached drawings. In the drawings.

DETAILED DESCRIPTION

Figure 1:
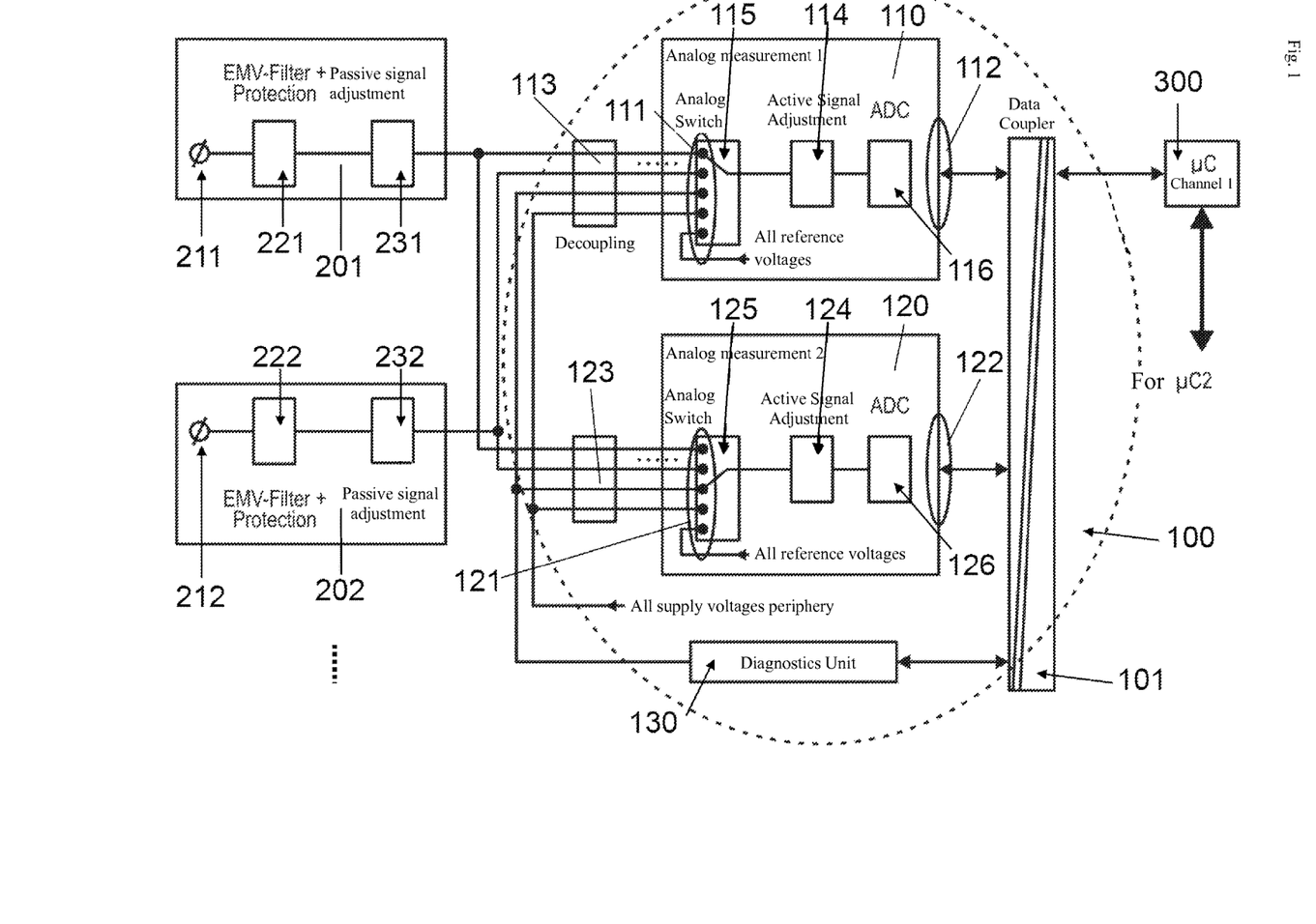
FIG. 1 shows a first embodiment of an analog signal input circuit showing preferred and particularly beneficial embodiments with only one analog signal detection channel.

Reference is made first to FIG. 1, in which an analog signal input circuit is shown with a first number of an analog signal detection channel 100, a number of two analog signal detection circuits 110 and 120, and at least one diagnostics circuit 130, in a very simplified fashion.

Due to the fact that the individual sub-functions of an analog signal detection circuit could previously be diagnosed only with very high expenses and under certain circumstances, no diagnosis without retroactive effects is possible, beneficially proven analog circuit components are used even according to the suggested solutions for detecting analog signals, with the analog inputs, as shown in the following by the solutions according to the invention, which are switched to each other such that the overall circuit can be tested almost 100% and the analog circuit components therefore are also suitable for the use in safety technology. For this purpose, in addition to the analog signal detection circuits, a diagnostics circuit is provided, which beneficially is designed such that it is capable of providing all signals required for the complete testing of the analog signal detection circuits. The internal design of these analog signal detection circuits can therefore be implemented in general like in standard analog modules, with the necessary diagnostics coverage being ensured by the diagnostics circuit.

A number of analog signal inputs are further shown in FIG. 1, according to FIG. 1 a number of two analog signal inputs 201 and 202. It shall be pointed out that a number of one analog signal input or also more than two analog signal inputs may be provided within the wording "a number of analog signal inputs" or "a second number of analog signal inputs" and accordingly this fact is covered by the claims so that the number may be at least one and otherwise may be of an arbitrary quantity.

For the following description of the embodiment according to FIG. 1 it is assumed that an analog input signal is applied at least at one signal input 201 or 202, according to an analog input parameter such as temperature or pressure, which preferably serves in processing industry for the process monitoring and thus it can be assumed in the beneficial embodiment of the invention that such an analog input signal is generally of decisive relevance for the safety of the process to be monitored, not shown in greater detail.

As further discernible from FIG. 1, the signal input 201 shows an input terminal 211, and in a beneficial embodiment further an input protection circuit 221 electrically switched downstream the input terminal 211. The input protection circuit 221, in general not mandatory, may however advantageously limit the transients for the analog signal input circuit and/or perform a noise filtration. In an optionally beneficial alternative addition, the signal input 201 further shows a passive signal adjustment unit 231, electrically switched downstream in reference to the input terminal 211, or as discernible in FIG. 1, in a beneficially further addition to the input protection circuit 221, with here the passive signal adjustment unit 231 being beneficially switched electrically downstream in reference to the input protection circuit 221.

With the passive signal adjustment unit 231 the current and/or voltage signals can be brought to a common measuring level.

In a similar fashion, other analog signal inputs may show, in addition to an input terminal, an input protection circuit and/or a passive signal adjustment unit, whereby in the embodiment according to FIG. 1, in addition to the input terminal 212, the analog signal input 202 showing an input protection circuit 222 arranged electrically downstream and a signal adjustment unit 232 electrically arranged downstream [from the input protection circuit].

The analog signal detection channel 100 is now embodied to detect an analog input signal, not shown, applied at the analog signal input 201 or 202, and accordingly to issue an output signal according to an analog input signal detected, as described in greater detail in the following.

For this purpose, the analog signal detection channel 100 comprises, according to FIG. 1 in a solution according to the invention, two analog signal detection circuits 110 and 120 each and at least one first connection selection device 115, 125. The analog signal detection channel 100 beneficially includes also the diagnostics circuit 130. The first connection selection device is beneficially embodied as an analog switching unit, with preferably in every analog signal detection circuit 110 and 120 one analog switching unit 115 and/or 125 each being included.

Every analog signal detection circuit 110 and 120 further shows a first connection device 111 and/or 121 and a second connection device 112 and/or 122. Each of the analog signal detection circuits 110 and 120 can be connected at least successively with its first connection device 111 and/or 121 to the same analog signal input, e.g. 201 or 202, in order to detect an analog input signal, with both analog signal detection circuits 110 and 120 being embodied to issue output signals according to detected analog input signals matching each other at their respectively matching second connection devices 112 and/or 122.

In the normal operation of the analog signal input circuit and thus for the detection of the analog input signal applied at an analog signal input 201 or 202 and for the output of the output signal according to the detected analog input signal by the analog signal detection channel 100 however, only one of the two included analog signal detection circuits 110 and 120 are alternatingly selected for a certain determined period of time, with the first connection device 111 and/or 121 being connected to this analog signal input in order to detect this analog input signal and accordingly for the detected analog input signal the output signal of the analog signal detection channel is issued at its second connection device 112 and/or 122 as the output signal. The respectively other analog signal detection circuit, however, is selected in normal operation for this determinable period of time to be used for testing and/or diagnostics purposes and e.g. connected to the diagnostics circuit 130, and thus for this determinable period of time it is not connected to the first connection device with the analog signal input to detect the analog input signal. The first connection selection device 115, 125 is embodied for the purpose of connecting the respectively first connection device 111, 121 at least to either the analog signal input to be connected thereto or to the diagnostics circuit.

In a given state as shown in FIG. 1, thus e.g. the analog signal detection circuit 110 is selected and/or provided to be connected with its first connection device 111 to the analog signal input 201 for detecting the analog input signals applied thereto and, in response to the detected analog input signal, to issue at its second connection device 112 the output signal of the analog signal detection channel as the output signal, and the analog signal detection circuit 120 is provided to be connected to the diagnostics circuit 130 for diagnostics purposes.

In the embodiment according to FIG. 1, the analog switching units 115 and 125 provided by the first connection selection device connect accordingly in a mutual coordination the first connection device 111 to the analog signal input 201 and the first connection device 121 to the diagnostics circuit 130.

Beneficially, the first connection selection device or, provided in FIG. 1, the two analog switching units 115 and 125 providing the first connection selection device is/are embodied such that it is additionally possible to connect the two analog signal detection circuits 110 or 120, if desired, simultaneously to the same signal input as well.

More beneficially, one decoupling circuit 113 and/or 123 each are allocated to the first connection devices 111 and 121, by which one first connection device 111 or 121 each of the analog signal detection circuits 110 or 120 can be connected to the signal inputs 201 and 202 via the first connection selection device. The decoupling circuits 113 and/123 prevent any retroactive effect of the analog signal detection circuits 110 or 120 upon each other or upon the signal inputs 201 and 202 as well as retroactive effects of the signal inputs between each other, and they are generally embodied in an error-proof fashion and typically require no diagnostics.

Additional signal paths guided at the first connection selection device, as particularly originating at the diagnostics device 130, in order to allow connecting the first connection devices 111 or 121 of the analog signal detection circuits 110 or 120 to said signal paths, for introducing test and diagnostics signals for diagnostics purposes of the analog signal detection circuits, are therefore beneficially also guided via the decoupling circuits 113 and 123. For the internal monitoring of current and voltage sources, it is also provided that the supply voltages of the periphery as well as various other reference voltages required for diagnostics purposes and other signal paths may be guided via the decoupling circuits 113 and 123 to the first connection selection device, in order to allow connecting the first connection devices 111 or 121 of the analog signal detection circuits 110 or 120 to these signal paths when necessary. As discernible in FIG. 1, in the exemplary embodiment shown, all other reference voltages required for diagnostics purposes but not originating in diagnostics circuits 130 are not guided via the decoupling circuits 113 and 123 to the first connection selection device.

Using the analog switching units 115 and 125 shown in FIG. 1, selected individual analog signals can be applied to the respective analog signal detection circuit 110 and/or 120 in a very simple fashion. The analog switching units 115 and 125 are tested by switching the signals to be applied and by the above-mentioned test using the diagnostics unit.

When both analog signal detection circuits 110 and 120 are briefly operated in parallel with the same input signal for testing the above-mentioned switching of the analog signal detection circuits 110 and 120 and the output signals are compared, this allows, even during operation, a 100% diagnostics coverage of the analog switching units 115 and 125.

As further discernible from FIG. 1, each of the analog signal detection circuits 110 and 120 show beneficially an active signal adjustment device 114 and/or 124, with the individual analog signals applied at the respective analog signal detection circuit 110 and/or 120 being supplied thereto for an application-specific processing of the analog signals and perhaps to an analog/digital converter 116 and/or 126, with the respective digital signal connection of the analog/digital converter being switched to the respective second connection device 112 and/or 122, and the respective analog signal connection of the analog/digital converter being switched in the direction towards the first connection selection device, and thus according to the example shown in FIG. 1 to the active signal adjustment device 114 and/or 124.

In order to practically connect also the second connection devices 112 and 122, appropriately selected perhaps with a processing device 300 for further processing the output signal of the analog signal detection channel, particularly specific for an application, or to connect it in a simple fashion to the diagnostics circuit 130, the analog signal detection channel 100 beneficially comprises a second connection selection device 101, which is embodied to implement these connections, particularly in coordination with the first connection selection device.

It shall be pointed out that the control of the first connection selection device for the alternating selection of the analog signal detection circuits to be used for connecting one or the other analog signal input for a certain period of time for detecting analog input signals and/or for test and/or diagnostics purposes, and the perhaps existing second connection selection devices, is not shown in the drawing; however, for one trained in the art, this can be implemented by measures known per se. Due to the fact that the control is not considered an essential component of the invention, it is not described in greater detail, here. The control may however occur e.g., by the diagnostics circuit 130 itself or, as shown in FIG. 1, e.g., by a micro-controller provided as an application-specific processing device 300. Based on the use of a micro-controller shown in FIG. 1 as another processing device 300, the use of the analog/digital converter 116 and/or 126 and the use of the digitally operating connection selection device 101, marked data coupler in FIG. 1, is particularly beneficial in the practical application.

This diagnostics circuit 130 beneficially includes however all required testing devices required for a determined diagnostics coverage for testing the analog signal detection circuits 110 and 120. Their control can also occur, depending on the embodiment, by the diagnostics circuit 130 itself, or by another device, as embodied e.g., in the micro-controller sketched as the processing device 300, e.g., comprising a safety logic. Here, an allocation of the tasks of the diagnostics functionalities may be provided between the diagnostics circuit 130 and the micro-controllers with regards to controlling.

In the following, reference is made to FIGS. 2A and 2B (hereinafter, collectively referred to as FIG. 2). FIG. 2 shows another embodiment of an analog signal input circuit showing preferred and particularly beneficial embodiments, however comprising two analog signal detection channels. Due to the fact that the components are or act essentially identically or act in the same fashion as described in reference to FIG. 1, in the following only the differences according to the invention are described.

The first analog signal detection channel 100 is here sketched according to FIG. 2 above the dot-dash line and the second analog signal detection channel 100' below the dot-dash line. Similarly, of course additional analog signal detection channels may be provided so that the number of analog signal detection channels increases accordingly. Each analog signal detection channel 100 and 100' shows in turn two analog signal detection circuits 110 and 120 and/or 110' and 120', which are designed as described in reference to FIG. 1, and a diagnostics circuit 130 and/or 130'.

Figure 2A:
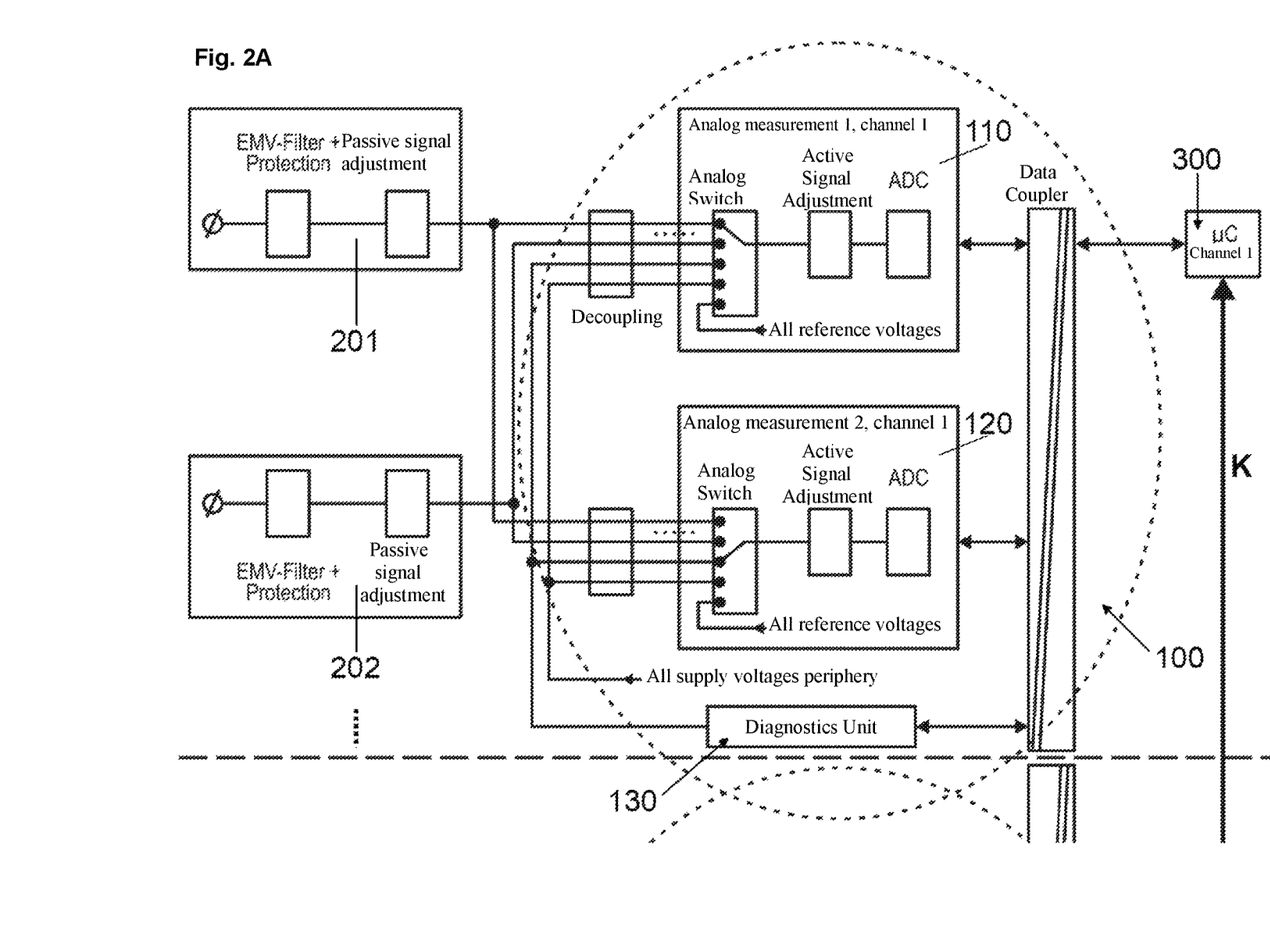
FIGS. 2A and 2B show another preferred and particularly beneficial embodiment of an analog signal input circuit showing embodiments with two analog signal detection channels.
Figure 2B:
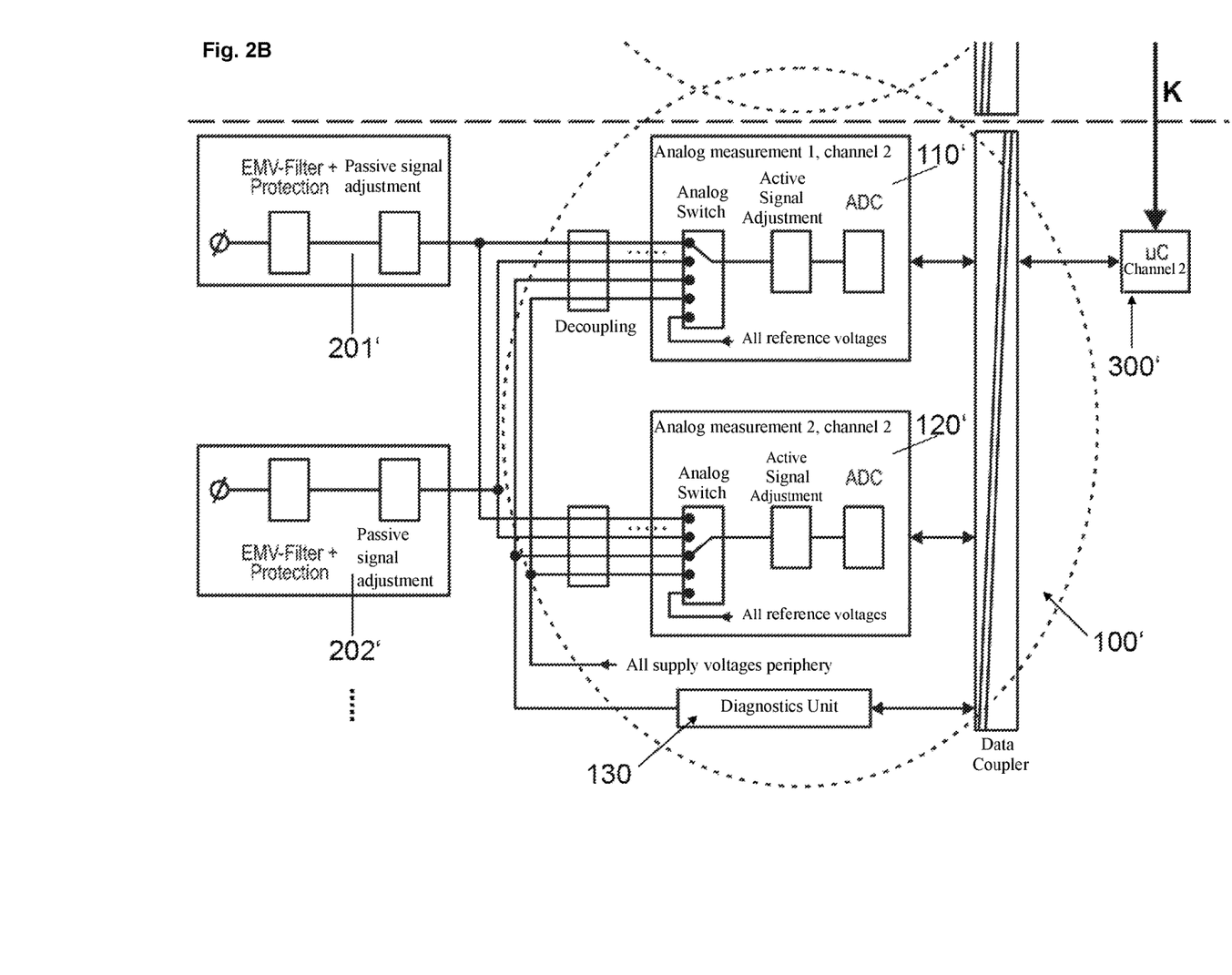

The number of two analog signal detection channels 100 and 100' shown in FIG. 2 can be operated redundantly or be switched together to form a redundancy block. Similar to FIG. 2, shown with the double arrow marked "K," for this purpose e.g., respectively one processing device 300 arranged downstream in reference to an analog signal detection channel 100 communicates with a processing device 300' arranged downstream in reference to the other analog signal detection channel 100'. Additionally, the signal inputs may also be detected redundantly, i.e. the same signals are applied at the signal input 201 and the signal input 201' and the same signals are also applied at the signal input 202 and at the signal input 202' and therefore they can be redundantly detected via the analog signal detection channels 100 and 100'.

The voltage supply of the periphery of both analog signal detection channels 100 and 100', or also additional ones, may be supplied by the same supply voltages or separately, particularly with highly available devices the supply of the two analog signal detection channels 100 and 100' can beneficially be realized independently from each other. The monitoring of the individual voltages occurs then in turn by the diagnostics circuit 130 or 130' of the respective analog signal detection channel 100 and/or 100'.

In summary, it can be stated that at any arbitrary point of time the detection of the analog input signals can occur via the analog signal detection circuit 110 or 120 of every analog signal detection channel 100, 100' connected to the input respectively to be measured (from a number of 1 to n).

This analog signal detection circuit 110 or 120 of every analog signal detection channel 100, 100' can further be switched between the signal inputs in order to successively detect the status of the individual analog signal inputs. In other words, this active analog signal detection circuit can therefore be switched between the individual signal inputs in order to detect the input values, with it being possible to control the switching between the signal inputs, e.g. by a previous prioritization of the individual signal inputs.

The second analog signal detection circuit 120 and/or 110 of each analog signal detection channel 100, 100' which at this point of time is not involved in any safety function during normal operation can consequently be subjected to testing, which is performed by the diagnostics unit without in any way compromising the functionality of the analog signal detection channel 100, 100' and thus any safety function connected thereto. As soon as the test and/or the diagnosis has been concluded, the tested and/or diagnosed analog signal detection circuit can be included once more in the safety chain and the other analog signal detection circuit can be removed from the safety chain and connected to the diagnostics unit for test purposes. Once this analog signal detection circuit has also been completely tested, another switching occurs for example, in which the original status is reestablished. Additionally it is possible to operate both analog signal detection circuits of an analog signal detection channel in a parallel fashion in order to, e.g., compare the determined measurements of both analog signal detection circuits with each other and this way to further improve the diagnostic coverage. Due to the fact that during the test the analog signal detection circuit to be tested is not part of any safety chain, each analog signal detection circuit can be tested by 100%. Consequently, the diagnostic/test pulses cannot compromise any safety function and additional conditions can be tested, which would be impermissible during operation in a safety chain, e.g., various settings of an active signal adjustment, e.g., of the amplification.

In the event of a malfunction, the analog signal input circuit according to the invention provides a secure diagnosis of which of the analog circuits is defective and accordingly it can allow, based on the "redundant" analog signal detection circuit in every analog signal detection channel, a secure further operation in case of a malfunction with limited diagnostics capacities.

Further, using the diagnostics circuit, a calibration of an analog signal detection circuit can also be performed during operation without any temporal and/or functional influence of the running measurements and the device functions (self calibration). This way, via the diagnostics unit, the entire analog signal input circuit can also be calibrated during operation, thus with the invention a proof-test (previous functions test) can be completely replaced by testing and/or diagnosing the analog signal input circuit during operation, depending on application.

Due to the fact that any diagnostics performed by the diagnostics circuit has no influence upon the temporal behavior, neither with regards to the device comprising the analog signal input circuit nor with regards to the devices whose analog signal is detected at the signal inputs, the diagnostics performed by the diagnostics circuit furthermore ensures, for example, the synchronous signal detection and transfer to the superimposed network. For example, no test signals are visible at the input terminal of the signal input.

The diagnostics performed by the diagnostics circuit can therefore also test the conditions of the analog signal detection circuits, which is impermissible in an active measurement of the input signals. Accordingly, the entire test range is improved in reference to solutions of prior art; consequently, the results of the quantification are improved as well. Additionally, the test and/or the diagnosis can occur simultaneously with the detection of the analog input signals, particularly also simultaneously with the detection of analog input signals relevant for the safety of a process.

The diagnostic/test patterns used by the diagnostics circuit can, e.g., also be taken from the development process, reducing the expenses for the development for a diagnostics circuit. Additionally, the invention provides a cost-effective implementation, because for two analog signal detection circuits each only one diagnostics unit is required.

An essential aspect of the invention comprises therefore that an analog signal detection circuit of the analog signal detection channel detects an analog signal applied at the analog signal input, while another analog signal detection circuit of the same analog signal detection channel is tested and/or diagnosed for a certain period of time. After the test and/or the diagnostics they then can and will be switched, i.e. the tested analog signal detection circuit accepts for a certain period of time after the change the execution of the measurements, while the first analog signal detection circuit is tested.

Figure 3:
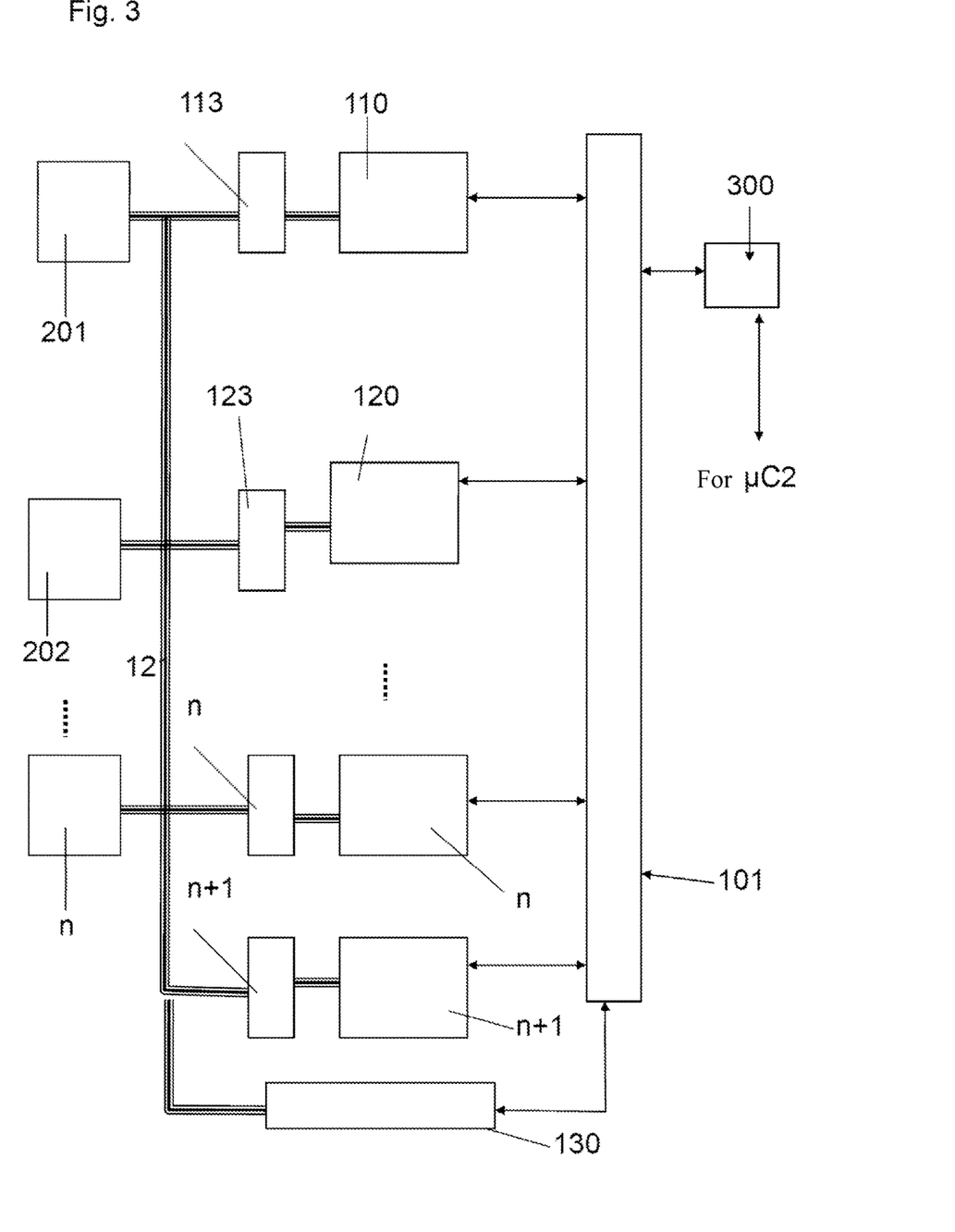
FIG. 3 shows a sketch of another embodiment of an analog signal input circuit based on FIG. 1 with only one analog signal detection channel, particularly however for the detection of faster and/or time-critical analog input signals.

While FIG. 1 and FIG. 2 sketch solutions particularly for detecting slow analog input signals, with a number of one to n analog signal inputs and with two analog signal detection circuits each per analog detection channel, in which therefore an analog signal detection circuit is connected between the signal inputs, while the other one is connected to the diagnostics unit or additional signals, such as reference voltages or supply voltages, in order to perform measurements for test purposes, whereby after the test an exchange occurs of the two analog signal detection circuits, FIG. 3 shows a sketch of additional embodiments of an analog signal input circuit based on FIG. 1 with only one analog signal detection channel being discernible, which is further improved particularly for the detection of faster and/or time-critical analog input signals. Due to the fact that the components are essentially identical or act in the same fashion, as described in reference to FIG. 1 or FIG. 2, in the following only the differences essential for the invention are discussed.

In the solution according to FIG. 3 once more a number of one to n analog signal inputs is provided; however, an analog signal detection channel includes a number of at least three analog signal detection circuits and maximally a number of analog signal detection circuits which is greater by one than the number of analog signal inputs.

In FIG. 3 the number of analog signal inputs is therefore indicated with 201, 202, to n, and the number of analog signal detection circuits is therefore indicated with 110, 120, to n, n+1. Accordingly, beneficially respective decoupling circuits 113, 123 to n, n+1 may be allocated to the analog signal detection circuits and/or first connection devices not explicitly shown in FIG. 3, by which the analog signal detection circuits can be connected to the signal inputs, the diagnostics unit 130, or additional signals, such as reference voltages and supply voltages for performing measurements for test purposes via the connection selection device, not shown explicitly in FIG. 3. Due to the fact that every analog signal detection circuit of an analog signal detection channel 100 can be connected with its first connection device to respectively one analog signal input from a number of analog signal inputs in order to detect an analog input signal, consequently several signal inputs can simultaneously be connected to several analog signal detection circuits for executing measurements; thus, depending on the embodiment, maximally n analog signal detection circuits are available for maximally n signal inputs. An analog signal detection circuit is selected for a certain period of time alternatingly, e.g., according to FIG. 3 the analog signal detection circuit "n+1," to be tested and/or diagnosed, and thus, e.g., connected to the diagnostics unit 130. After the test and/or diagnosis, once more a switch of the analog signal detection circuit occurs, i.e. the tested analog signal detection circuit assumes the execution of input signal detection, is thus connected to one of the signal inputs, while the analog signal detection circuit, which up to this point of time was connected to the signal input, is now tested. This structure is therefore better suited for detecting faster and/or time-critical signals. Based on the embodiments according to FIG. 1 and FIG. 2, additional signals, such as reference voltages and supply voltages, can in turn be measured for test purposes and/or several analog signal detection channels can be operated in parallel, particularly redundantly or switched together to form a redundancy block.

LIST OF REFERENCE CHARACTERS 100, 100' analog signal detection channel
101 second connection selection device
110, 110', 120, 120' analog signal detection circuit
111, 121 first connection device
112, 122 second connection device
113, 123 decoupling circuit
114, 124 active signal adjustment device
115, 125 first connection selection device, particularly an analog switching unit
116, 126 analog/digital converter
130, 130' diagnostics circuit
201, 201', 202, 202' analog signal input
211, 212 input terminal
221, 222 input protection circuit
231, 232 passive signal adjustment unit
300, 300' processing device

What is claimed is:

1. An analog signal input circuit to process analog input signals relevant for the safety of a process with a first number of at least two analog signal detection channels (100; 100'), which can be operated redundantly or can be connected to form a redundancy block, with
each analog signal detection channel (100; 100') being embodied to detect an analog input signal applied at an analog signal input from a second number of analog signal inputs (201, 202; 201', 202') and, responding to a detected analog input signal, issuing an output signal;
each analog signal detection channel (100; 100') respectively including two analog signal detection circuits (110, 120; 110', 120'), at least one diagnostics circuit (130; 130') and at least one first connection selection device (115, 125);
each analog signal detection circuit (110, 120; 110', 120') comprising a first connection device (111, 121) and a second connecting device (112, 122);
each of the analog signal detection circuits (110, 120; 110', 120') of an analog signal detection channel (100; 100') being able to connect to its first connection device (111, 121) with the same analog signal input of the second number of analog signal inputs (201, 202; 201', 202') for detecting an analog input signal, at least successively, and both analog signal detection circuits (110, 120; 110', 120') of an analog signal detection channel (100; 100') being embodied such that, responding to detected analog input signals matching their second connection devices (112, 122) issuing matching output signals;
each analog signal detection channel (100; 100') for the detection of the analog input signal applied at one analog signal input from the second number of analog signal inputs and for the responding output of the output signal for the detected analog input signal respectively one of the two included analog signal detection circuits is selected alternatingly for a certain period of time, not connected to its first connection device with this analog signal input for detecting this analog input signal, but used for test and/or diagnostic purposes, and the respectively other two included analog signal detection circuits (110, 120; 110', 120') are selected for this certain period of time to be connected to their first connection device with this analog signal input for detecting this analog input signal and responding to the detected analog input signal issuing the output signal of the analog signal detection channel at this second connection device as the output signal, with the first connection selection device (115, 125) being embodied for the purpose of connecting the respectively first connection device (111, 121) of the two included analog signal detection circuits (110, 120; 110', 120') in response to the selection at least to either the analog signal input to be connected or to the diagnostics circuit for introducing test and diagnostic signals.

2. An analog signal input circuit to process analog input signals relevant for the safety of a process with a first number of at least two analog signal detection channels (100; 100'), which can be operated redundantly or can be connected to form a redundancy block, with
each analog signal detection channel (100; 100') being formed, to detect analog input signals applied at a second number of at least two analog signal inputs (201, 202; 201', 202') and in response issue output signals for the detected input signals;
each analog signal detection channel (100; 100') respectively showing a third number of analog signal detection circuits (110, 120; 110', 120'), at least one diagnostics circuit (130; 130') and at least one first connection selection device (115, 125);
with the third number amounting to at least three and being maximally greater by one than the second number;
each analog signal detection circuit (110, 120; 110', 120') comprising a first connection device (111, 121) and a second connection device (112, 122);
each of the analog signal detection circuits (110, 120; 110', 120') of an analog signal detection channel (100;

100') with its first connection device (111, 121) is able to be connected to respectively one analog signal input from the second number of analog signal inputs (201, 202; 201', 202') for detecting an analog input signal, with it being possible to connect each of the analog signal detection circuits (110, 120; 110' 120') of an analog signal detection channel (100; 100') with its first connection device (111, 121) to the same analog signal input of the second number of analog signal inputs (201, 202; 201', 202') for detecting an analog input signal, at least successively, and all of the third number of analog signal detection circuits (110, 120, 110', 120') of an analog signal detection channel (100; 100') being embodied, to issue at their second connection devices (112, 122) matching output signals, responding to detected, matching analog input signals;

one analog signal detection circuit is selected alternatingly for a certain period of time for each analog signal detection channel (100; 100') for detecting analog signal input signals applied at signal inputs of the second number of analog signal inputs and for the respective output of output signals in response to the detected analog input signals, not connected to its first connection device with an analog signal input for detecting an analog input signal, but used for test and/or diagnostic purposes, and all except for this one being selected from the third number of included analog signal detection circuits (110, 120; 110', 120'), each for this certain period of time, to be connected to the first connection devices with certain analog signal inputs of the second number of analog signal inputs for detecting analog input signals, and issuing at their second connection devices as output signals the output signals of the analog signal detection channel, responding to the detected analog input signals, with the first connection selection device (115, 125) being embodied for the purpose of connecting the respectively first connection devices (111, 121) of all included analog signal detection circuits (110, 120; 110', 120') in response to the selection at least to either a certain analog signal input to be connected or to the diagnostics circuit for introducing test and diagnostic signals.

3. The analog signal input circuit according to claim 1, with at least one analog signal detection channel (100, 100') being embodied to process also digital signals, and each analog signal detection circuit (110, 120) of this analog signal detection channel comprising an analog/digital converter (116, 126), with its digital signal connection being switched to the respectively second connection device (112, 122) and with its analog signal connection being switched in the direction towards the first connection selection device.

4. The analog signal input circuit according to claim 1, with each analog signal detection channel showing a second connection selection device (101), which is embodied to connect, in coordination with the first connection selection device (115, 125), the second connection devices (112, 122) accordingly selected with one processing device (300) provided for the further processing of output signals of the analog signal detection channel or for connecting to the diagnostics circuit (130).

5. The analog signal input circuit according to claim 1, with the first connection selection device (115, 125) being embodied to allow selecting a connection of one respective first connection device (111, 112) to the analog signal input to be connected, to the diagnostics circuit (130), to at least one reference voltage, or to at least one supply voltage of a peripheral device.

6. The analog signal input circuit according to claim 1, with the analog signal detection circuit including an active signal adjustment device (114, 124).

7. The analog signal input circuit according to claim 1, with a decoupling circuit (113, 123) being allocated to the first connection device (111, 112).

8. The analog signal input circuit according to claim 1, with at least one analog signal input of the second number of analog signal inputs (201, 202, 201', 202'), in addition to an input terminal (211, 212), comprising an input protection circuit (221, 222) and/or a passive signal adjustment unit (231, 232).

9. The analog signal input circuit according to claim 1, with the first connection selection device being embodied as an analog switching unit (115, 125), with one such analog switching unit being included in each analog signal detection circuit (110, 120).

* * * * *